United States Patent [19]

Iwase et al.

[11] Patent Number: 5,266,427
[45] Date of Patent: Nov. 30, 1993

[54] DISPLAY BOARD AND METHOD FOR PRODUCING THE SAME

[75] Inventors: Teruhiko Iwase, Kariya; Takeshi Imai, Obu; Toshio Koura, Nagoya, all of Japan

[73] Assignee: Nippondenso Co., Ltd., Kariya, Japan

[21] Appl. No.: 863,319

[22] Filed: Apr. 1, 1992

Related U.S. Application Data

[63] Continuation of Ser. No. 422,882, Oct. 18, 1989, abandoned.

[30] Foreign Application Priority Data

| Oct. 18, 1988 | [JP] | Japan | 63-262181 |
| Oct. 18, 1988 | [JP] | Japan | 63-262182 |
| Jun. 27, 1989 | [JP] | Japan | 1-164520 |
| Oct. 6, 1989 | [JP] | Japan | 1-262535 |

[51] Int. Cl.$^5$ .............................. G03C 3/00
[52] U.S. Cl. ............................ 430/15; 430/13; 430/14; 430/257; 430/293; 428/195
[58] Field of Search ............... 430/13, 14, 15, 257, 430/293; 428/195

[56] References Cited

U.S. PATENT DOCUMENTS

| 3,615,435 | 10/1971 | Fu-Hua Chu et al. | 430/293 |
| 3,904,411 | 9/1975 | Erickson et al. | 430/257 |
| 4,191,572 | 3/1980 | Cohen et al. | 430/293 |
| 4,304,837 | 12/1981 | Viola . | |
| 4,482,625 | 11/1984 | Namiki et al. . | |
| 4,619,876 | 10/1986 | Woodward | 430/13 |
| 4,650,738 | 3/1987 | Platzer et al. . | |
| 4,705,745 | 11/1987 | Kitchin et al. | 430/293 |
| 4,771,368 | 9/1988 | Tsukamoto et al. . | |
| 4,855,199 | 8/1989 | Bolon et al. | 430/14 |
| 4,882,262 | 11/1989 | Wilwerding | 430/13 |
| 4,933,258 | 6/1990 | Shinozaki et al. . | |
| 4,935,331 | 6/1990 | Platzer et al. | 430/257 |
| 5,008,166 | 4/1991 | Aoki | 430/293 |
| 5,053,300 | 10/1991 | Imai et al. | 430/15 |

FOREIGN PATENT DOCUMENTS

| 182031 | 5/1986 | European Pat. Off. . | |
| 2653428 | 11/1976 | Fed. Rep. of Germany | 430/15 |
| 3342681 | 5/1984 | Fed. Rep. of Germany . | |
| 3704574 | 8/1987 | Fed. Rep. of Germany . | |
| 3720726 | 1/1988 | Fed. Rep. of Germany . | |
| 59-97140 | 6/1984 | Japan . | |
| 62-67529 | 3/1987 | Japan . | |
| 63-121046 | 10/1988 | Japan . | |
| 625425 | 5/1946 | United Kingdom . | |

*Primary Examiner*—Charles L. Bowers, Jr.
*Assistant Examiner*—Thomas R. Neville
*Attorney, Agent, or Firm*—Cushman, Darby & Cushman

[57] ABSTRACT

A display board has a substrate, a transparent photopolymerization resin layer formed on the substrate, and a picture layer formed in a surface of the transparent photopolymerization resin layer. The picture layer is composed of at least one dots-shaped colored photopolymerization resin. This display board is produced by exposing a colored photopolymerization resin film supported by a support member through a negative having a predetermined picture pattern to form a dots-shaped colored photopolymerization resin layer on the support member, transferring the dots-shaped colored photopolymerization resin layer to a surface of a transparent photopolymerization resin layer formed on a substrate to form a picture layer in the surface of the transparent photopolymerization resin layer, and setting the transparent photopolymerization resin layer in which the picture layer is formed to fix the picture layer.

12 Claims, 14 Drawing Sheets

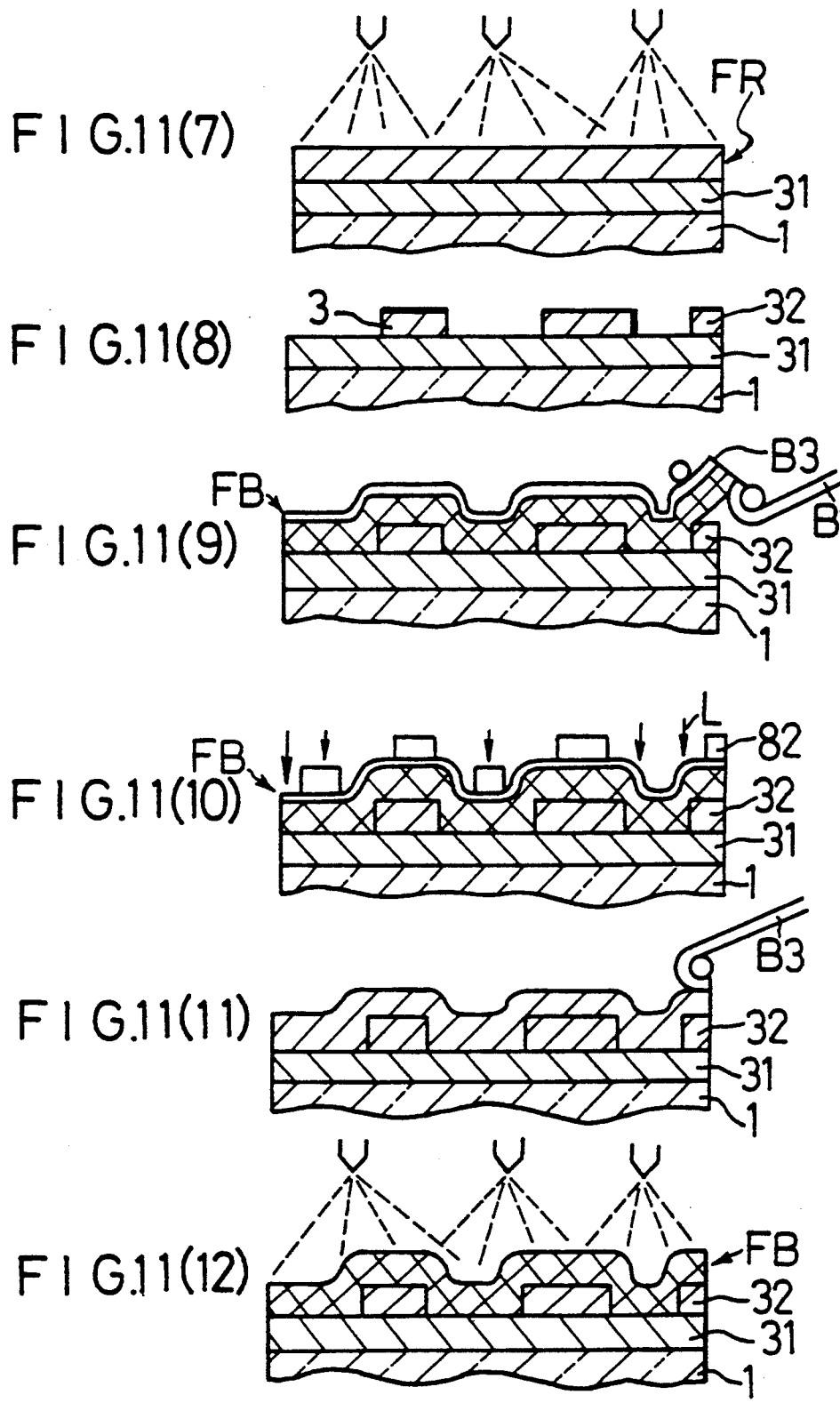

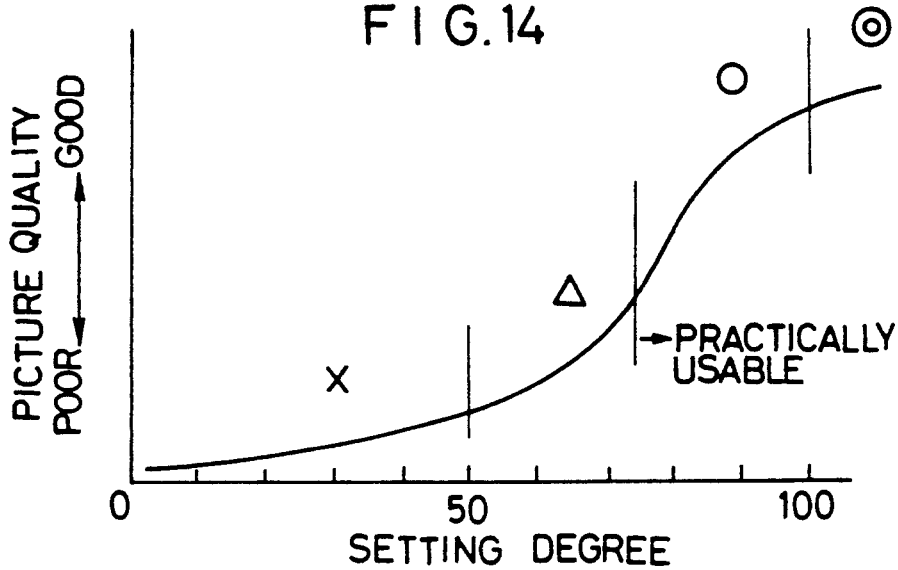
F I G. 14
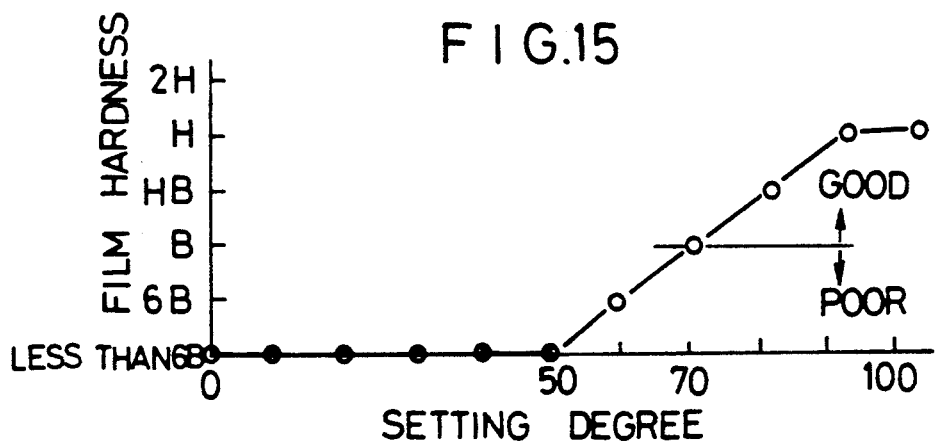
F I G. 15
EXPOSURE CONDITION: 3Kw ULTRA HIGH PRESSURE MERCURY LAMP
SETTING DEGREE = SET AMOUNT / TOTAL AMOUNT

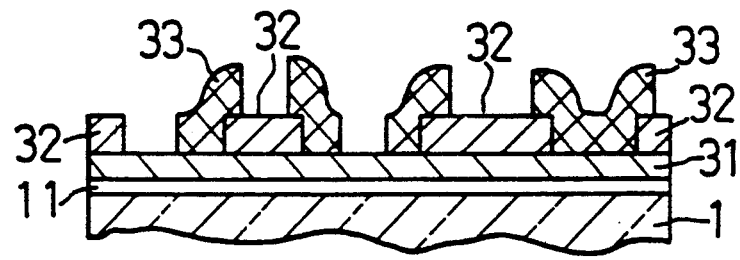
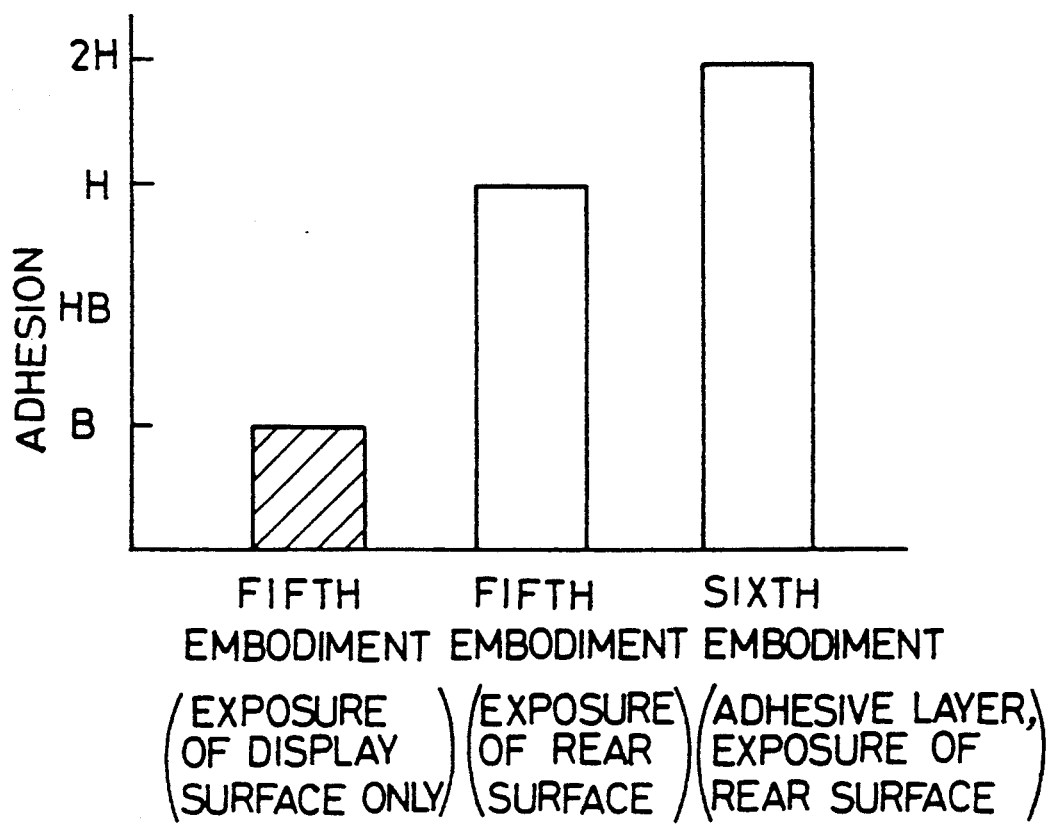

DISPLAY BOARD AND METHOD FOR PRODUCING THE SAME

This is a continuation of application Ser. No. 07/422,882, now abandoned, filed on Oct. 18, 1989, which was abandoned upon the filing hereof.

BACKGROUND OF THE INVENTION

1. Field of the Invention

The present invention relates to a display board by which a voluntary colored picture is formed on a substrate. Such a display board is used as a dial board or the like of a tachometer on a speedometer of a vehicle, for example.

2. Description of the Prior Art

Letters, figures or the like on a dial board of a meter are conventionally formed on a resin substrate by printing, especially by screen printing. The screen printing enables the printing of a thick paint film to provide a deep picture.

However, the above screen printing uses liquid ink diluted by solvent and therefore cause problems of contamination of the working environment, and fire due to the evaporation of the solvent within the ink, requiring a time for removing ink from a printing plate clogged therewith and controlling the viscosity of ink. This also requires special skill in controlling these operations, or the like.

Accordingly, recently, a photopolymerization ink containing no solvent and setting in a short time has been proposed. This photopolymerization ink takes advantage of the photosetting property of the photopolymerization resin. It has low viscosity and high fluidity before light irradiation and therefore does not require any solvent.

However, this photopolymerization ink requires the addition of reactant type diluent (for a monomer of low molecular weight) in order to adjust the viscosity thereof so as to be properly suited to the screen printing. This diluent functions similarly to the solvent, so that the unreacted substance gradually evaporates from the paint film. Moreover, the photopolymerization ink is of a low molecular weight as a whole and therefore has problems of large scale shrinkage due to setting, shortage of adhesion, lack of flexibility, or the like. In addition, the production cost is expensive so that photopolymerization ink is insufficient for practical use.

Moreover, multicolor printing has been desired in order to improve the appearance of the dial board, and the visibility thereof. In order to satisfy the above desire, the conventional screen printing uses printing plates and inks of the same number as the number of colors. This results in a troublesome producing processes and as increased production cost.

Meanwhile, offset printing has been mainly adopted as the multicolor printing in the printing trade. However, in applying this offset printing to a display board, this offset printing has also problems that ink is liquid, the color density of each printing plate is insufficient, or the like.

SUMMARY OF THE INVENTION

It is an object of the present invention to provide a display board which is capable of displaying a picture of excellent quality with voluntary colors, and a method for producing such a display board without using any solvent or reactant type diluent with the consequent improvement of the working environment and the work efficiency.

The display board of the present invention is provided with a substrate and a picture layer of a voluntary color, which is formed on the substrate. The picture layer is composed of a colored photopolymerization resin containing coloring agent which can be dye or pigment. The photopolymerization resin is exposed and set to form a voluntary picture pattern.

In the display board of the present invention, the picture layer is composed of colored photopolymerization resin. Therefore, a voluntary colored picture can be obtained only by pasting the photopolymerization resin to the substrate and setting a predetermined portions thereof.

The picture layer can be composed of at least one dots-shaped colored photopolymerization resin, which is retained by a transparent photopolymerization resin layer provided on the substrate.

The display board having the above-described construction is produced by the steps of forming a predetermined dots-shaped colored photopolymerization resin layer on a substrate by exposing a colored photopolymerization resin film supported by a support member through a negative having a predetermined picture pattern, forming a picture layer by transferring the dots-shaped colored photopolymerization resin layer to a surface of an unset transparent photopolymerization resin layer formed on a substrate, which is on the opposite side of the substrate, or laminating the transparent photopolymerization resin layer on the substrate after the dots-shaped colored photopolymerization resin layer is transferred to the substrate, and fixing the picture layer by exposing and setting the transparent photopolymerization resin layer provided with the picture layer.

The colored photopolymerization resin is polymerized and set due to light. Therefore, by exposing the colored photopolymerization resin through a negative having a desired picture pattern, the desired picture layer can be easily formed. Moreover, by composing the picture layer of dots-shaped colored photopolymerization resin, and retaining the picture layer by the transparent photopolymerization resin layer, the strength of the picture layer is improved, and the quality of the picture is also improved. This results from that the transparent photopolymerization resin layer retaining the picture layer does not contain any coloring agent so as to transmit light whereby higher setting degree can be obtained.

In addition, by combining a plurality of dots-shaped colored photopolymerization resins of different colors, particularly three primary colors, yellow, magenta and cyan, and black, a voluntary picture of voluntary colors can be formed.

The method according to the present invention does not require the formation of the conventional printing plates, and the preparation of ink, and accordingly is free from such problems as the troublesome viscosity control of ink, contamination of the working environment due to the evaporation of the solvent, clogging of the printing plates, and the like. Moreover, by forming the photopolymerization resin layer into a film shape, the handling thereof is facilitated as well as the control of operations, and the automation of the producing processes.

BRIEF DESCRIPTION OF THE DRAWINGS

FIG. 1 is a partially enlarged cross-sectional view of a dial board of a tachometer for a vehicle to which the first embodiment of the present invention is applied; n FIG. 2 is a front view of the dial board;

FIG. 3 is an enlarged cross-sectional view of a photopolymerization resin film for the formation of a picture layer used in the first embodiment;

FIGS. 4(1) through 4(9) are views showing the producing processes of the dial board;

FIG. 5 is an enlarged cross-sectional view of a substrate film used in the first embodiment;

FIGS. 9 through 16 illustrate a fifth embodiment of the present invention;

FIGS. 9 is a partially enlarged cross-sectional view of a dial board of a tachometer for a vehicle, to which the fifth embodiment is applied;

FIG. 10 is a front view of the dial board;

FIGS. 11(1) through 11(12) are views showing the producing processes of the dial board;

FIGS. 12 and 13 are partially enlarged cross-sectional views of a boundary of a picture layer of the dial board;

FIG. 14 is a view showing the relation between the setting degree of the colored photopolymerization resin and the picture quality;

FIG. 15 is a view showing the relation between the setting degree and the film hardness;

FIGS. 16 and 17 illustrate a sixth embodiment of the present invention;

FIG. 16 is a partially enlarged cross-sectional view of a display board;

FIG. 17 is a view showing the adhesion improvement effect obtained in the sixth embodiment;

FIG. 18 is a partially enlarged cross-sectional view of a display board;

FIG. 19 is a partially enlarged cross-sectional view of a picture for controlling the amount of the transmitted light;

DETAILED DESCRIPTION OF THE EMBODIMENTS

Hereinafter, the present invention will be explained in accordance with the embodiments with reference to the drawings.

Figure 2:
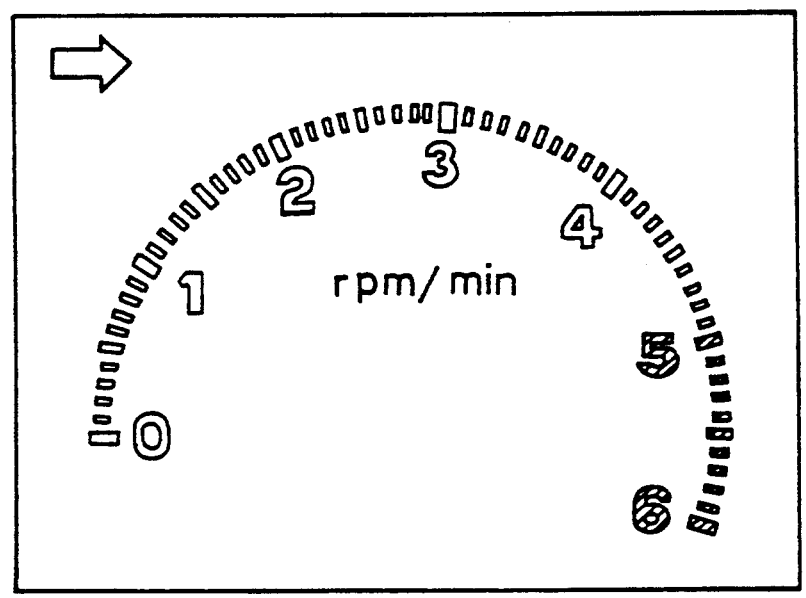

FIG. 2 is a dial board of a tachometer for a vehicle, to which the present invention is applied. On the dial board, figures, letters, scales and the like are displayed by combining photopolymerization resin layers of four colors that is yellow, magenta, cyan, and black. In FIG. 2, characters 0 through 6 designate the number of rotations in rpm/min.

Figure 1:
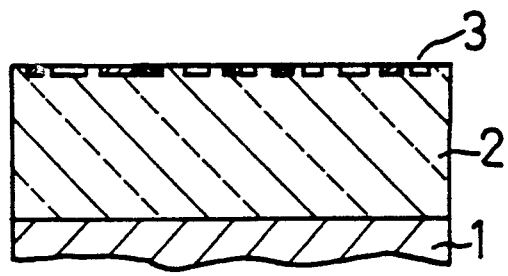
FIGS. 1 through 5 illustrate a first embodiment of the present invention.

FIG. 1 is a partially enlarged cross-section of FIG. 2. In FIG. 1, reference numeral 1 designates a resin substrate composed of a polycarbonate sheet, an acrylic plate or the like.

On the substrate 1 are successively formed a transparent photopolymerization resin layer 2 and a picture layer 3 wherein a picture pattern corresponding to the figures, scales and the like shown in FIG. 2 is formed. The picture layer 3 is composed of photopolymerization resin layers of four colors, that is yellow, magenta, cyan and black.

Figure 3:

The above-described dial board is produced as follows:

FIG. 3 illustrates a colored photopolymerization resin film F to be used for forming the picture layer 3. In FIG. 3, a colored photopolymerization resin layer F1 is formed on a support member F3. The surface of the colored photopolymerization resin layer F1 is protected by a protective film F2.

The colored photopolymerization resin layer F1 contains a coloring agent such as pigment, dye or the like, photopolymerization resin(molecular weight: tens to thousands), binder polymer(molecular weight: tens of thousands to hundreds of thousands), catalyst(-photopolymerization initiator), auxiliary agent(polymerization inhibitor) and the like. By voluntarily selecting the coloring agent, the layer F1 is colored yellow, magenta, cyan or black.

The density of each color is set as follows in accordance with the density range of ink for screen printing of a dial board.

yellow-based ink . . . 0.1 to 0.6
magenta-based ink . . . 0.2 to 0.7
cyan-based ink . . . 0.3 to 1.0
black-based ink . . . 0.8 to 3.5

The density of each color is measured by using a transmission density meter made by Dainihon Screen Co., Ltd. with setting the clear 0 without using any filter.

Examples of the photopolymerization resin are urethane acrylate, epoxy acrylate, polyol acrylate or the like. Especially, urethane acrylate is preferably used. And acryl-based polymer has a film property and an adhesion property suitable to the binder polymer. The thickness of the layer F1 is ordinarily 0.5 to 20 μm, preferably 1 to 10 μm in consideration of the color density, the trouble in the exposure and development, appearance of the picture, or the like.

The transparent photopolymerization resin layer 2 has a composition substantially equal to that of the colored photopolymerization resin layer F1 except for no pigment being included.

The support member F3 supports the colored photopolymerization resin layer F1 until being transferred to the transparent photopolymerization resin layer 2. The material for the support member F3 is desired to be easily peeled off the layer F1. Examples such a material are polyethylene terephthalate, polypropylene, polyethylene, polyvinyl alcohol, polyvinyl chloride and the like. The thickness of the support member F3 is ordinarily 10 to 150 μm, preferably 20 to 50 μm.

The material for the protective film F2 is desired to be easily peeled off the layer F1, and to have a good light transmission property in order to expose the colored photopolymerization resin layer F1 therethrough. The preferable examples of such a material are polyetylene and polypropylene. The preferable thickness thereof is ordinarily 10 to 50 μm.

Figure 4:
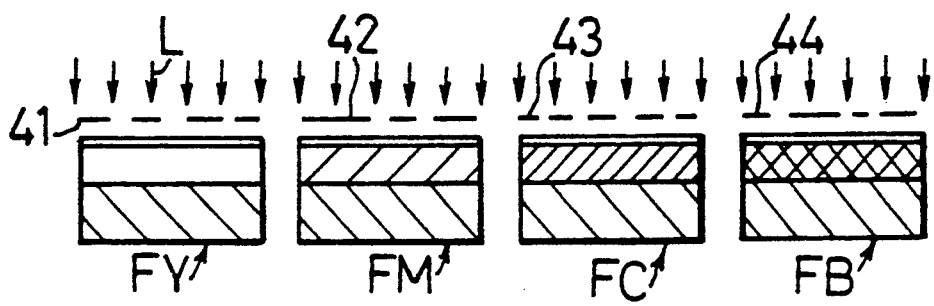
Figure 4:
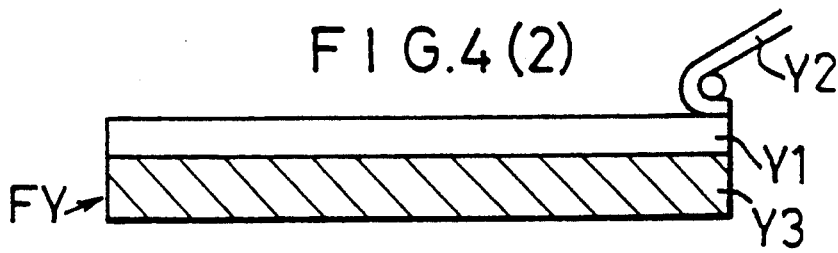
Figure 4:
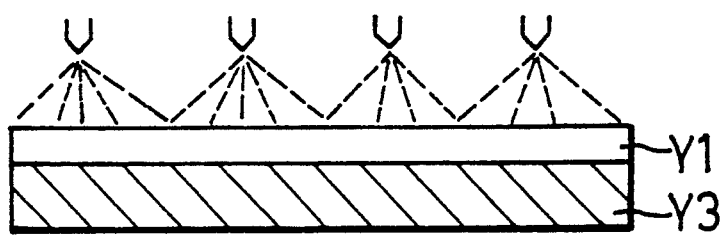
Figure 4:
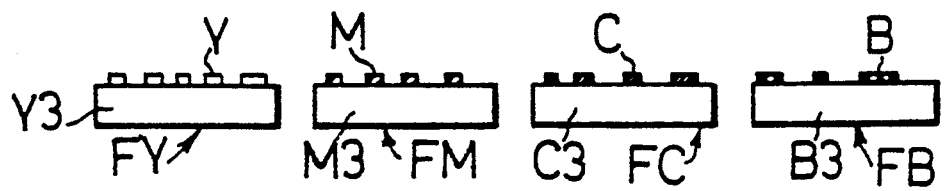
Figure 4:
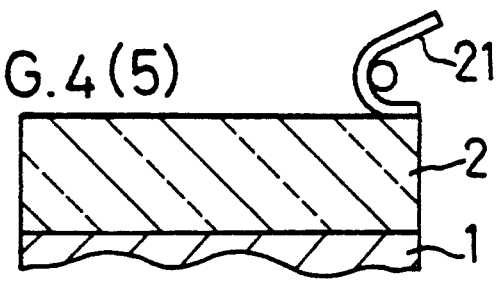
Figure 4:
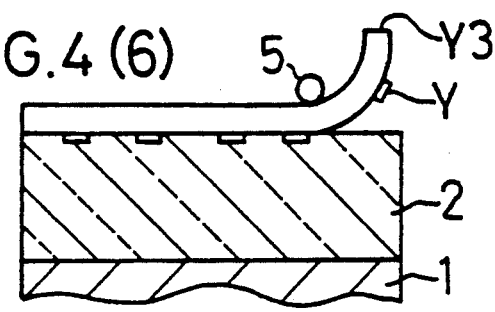
Figure 4:
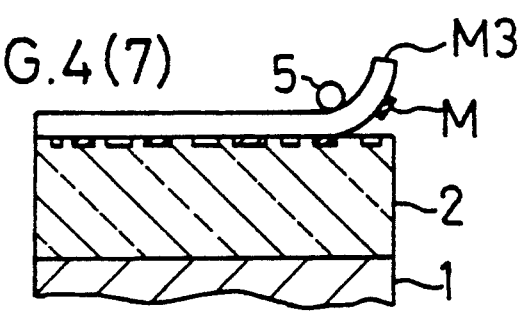
Figure 4:
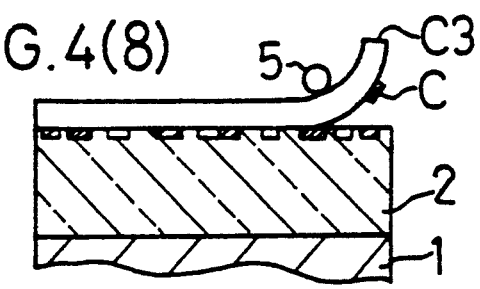
Figure 4:
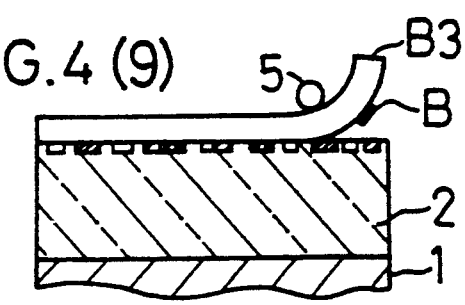

The photopolymerization resin films FY, FM, FC, FB of yellow, magenta, cyan, black, respectively, were prepared, and a display board was produced in accordance with the processes shown in FIGS. 4(1) through 4(9).

Firstly, in the process shown in FIG. 4(1), each of the films FY, FM, FC, FB is exposed through each of negatives 41, 42, 43, 44, each having a predetermined picture pattern. These negatives 41, 42, 43, 44 are dots-separated negatives which are previously formed by a color separater. This machine separates an original picture into yellow, magenta, cyan and black, and transforms the richness or lightness of each color to the size of the dots.

The exposure is performed by active energy rays such as ultraviolet rays L. In this case, an ultra high pressure mercury lamp is used. The amount of exposure is 100 mJ/cm$^2$ or more, and preferably 300 to 450 mJ/cm$^2$ for each of four colors in consideration of the difference in wavelength of light caused by the difference in light source of an exposure machine.

Next, in the process shown in FIG. 4(2), a protective film Y2 is peeled off a layer Y1, and in the process shown in FIG. 4(3), unexposed portions of the layer Y1 are removed by wet development using alkali or solvent, or dry development. In FIGS. 4(2) and 4(3), the yellow photopolymerization resin film FY is shown. The other colored films are also subjected to the same processes. The development method depends on the composition of the colored photopolymerization resin layer F1. For example, in the case of alkali development, 1%NaCO$_3$ aqueous solution is sprayed on the photopolymerization resin layer F1.

This results in each photopolymerization resin layer F1 reacting to light, and only firmly adhered and set portions remaining. As a result, on respective supporting members Y3, M3, C3, B3 are formed dot-shaped photopolymerization resin layers Y, M, C, and B. (Process shown in FIG. 4(4)).

Figure 5:
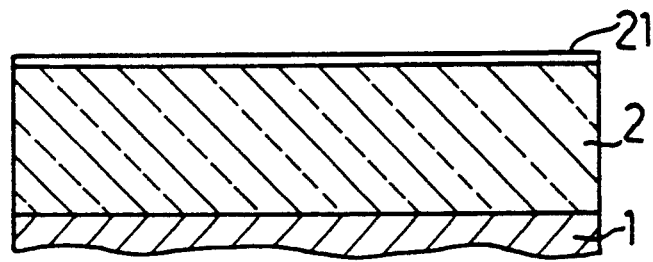

Then, by transferring these dot-shaped photopolymerization resin layers Y, M, C, and B to the transparent photopolymerization resin layer 2, the picture layer 3 is formed. It is convenient to previously paste the transparent photopolymerization resin layer 2 on the substrate 1, and protect the surface of the layer 2 by a protective film 21 as shown in FIG. 5.

In the process shown in FIG. 4(5), the protective film 21 is peeled off the layer 2, and dot-shaped photopolymerization resin layers Y, M, C and B are successively transferred to the layer 2 by means of a laminater 5(Process shown in FIGS. 4(6) through 4(9)). This results in the picture layer 3 compounded of these photopolymerization resin layers Y, M, C and B being formed in the transparent photopolymerization resin layer 2. Thereafter, the picture layer 3 is irradiated with ultraviolet rays again thereby setting the transparent photopolymerization resin layer 2 which retains the picture layer 3. Thus, the dial board as shown in FIG. 1 is obtained.

As described above, in accordance with the present invention, by forming the picture layer 3 in the transparent photopolymerization resin layer 2, the adhesion property of the picture layer 3 can be improved and the strength thereof is also improved. Moreover, since the picture layer 3 is exposed to the outside, deep and calm color can be perceived with the naked eye.

The display board is provided with a pointer in its central portion. This display board is subjected to drilling for pivotally securing the pointer to the display board, and punching for cutting the outer periphery thereof.

Table 1 shows the adhesion strength of the picture layer to the substrate.

In Table 1, A designates the display board composed of the substrate 1 and the picture layer 3, B designates the display board composed of the substrate 1, the transparent photopolymerization resin layer 2, and the picture layer 3. And in the cross cut test, the number of uncracked samples out of 100 samples were shown.

TABLE 1

| | PUNCHING (outer diameter) | SCREWING | CROSS CUT TEST (out of 100) |
|---|---|---|---|
| A | X (generation of chips and peelings) | X (generation of peelings) | X 30 or less |
| B | ○ | ○ | ○ 100 |

Moreover, the transparent photopolymerization resin layer 2 must be securely provided with fine appearance. Namely, when the thickness of the layer 2 is not uniform, or pin holes or the like is generated therein, bubbles or unevenness are formed in pasting the picture layer 3 on the layer 2 to spoil the fine appearance, and to excessively swell the picture at an increased environment temperature. In addition, too large layer thickness causes the flexibility to be lowered after the light setting process, and also causes the transmitted picture to lose the light amount of the light source. Accordingly, in view of the above points together with the material cost and adhesion property(coating property), the suitable thickness of the layer 2 is 0.5 μm to 100 μm, and preferably 1 μm, to 20 μm. This result is shown in Table 2.

TABLE 2

| Evaluation Item | Layer Thickness (μm) | | | |
|---|---|---|---|---|
| | 0.5 or less | 1 to 20 | 20 to 100 | 100 or more |
| Adhesion property | Δ | ⊙ | ⊙ | ⊙ |
| Flexibility | Δ | ⊙ | ○ | Δ |
| Light transmission property | ○ | ⊙ | ○ | Δ |
| Coating property | X | ⊙ | ○ | ○ |

Cross cut test
⊙ very good    100% network remains, only cut portions crack
○ good    100% network remains, vicinity of cut portions crack
Δ slightly poor    90 to 100% network remains
X poor    90% or less network remains Bending work
⊙ bending tester    φ2 O.K.
○    φ3 O.K.
Δ    φ3 or less
X    φ3 or less Light transmission property
⊙ no change of amount of transmitted light
○ amount of transmitted light scarcely changes
Δ amount of transmitted light slightly changes
X amount of transmitted light greatly changes Coating property
⊙ no bubble, no wrinkle, no swell
○ bubble, wrinkle and swell scarcely generate
Δ bubble and wrinkle slightly generate
X bubble and wrinkle unremovably generate The adhesion property, flexibility, light transmission property and coating property were examined by crosscut test, bending test, transmission density measurement, and laminating test, respectively.

Figure 6:
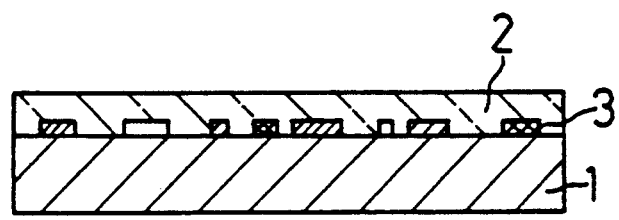
FIGS. 6 through 8 are partially enlarged cross-sectional views illustrating second through fourth embodiments of the present invention, respectively.

FIG. 6 illustrates a second embodiment of the present invention. In the second embodiment, the picture layer 3 is directly formed on the substrate 1, and the upper surface of the picture layer 3 is covered with the transparent photopolymerization resin layer 2. In accordance with the second embodiment, ultraviolet rays such as solar rays are cut to some degree to prevent the discoloration of the picture layer 3 thereby improving the picture quality. In this case, in order to prevent the lowering of the visibility of the picture, it is preferable to compose the transparent photopolymerization resin layer 2 of resin of high transmission property. Moreover, in order to improve the light resistance, such a resin as having a low ultraviolet rays transmission rate may be used, or ultraviolet rays absorbent may be included in the layer 2.

Furthermore, in accordance with the present invention, a frosted picture can be obtained by roughing the uppermost surface by hot pressing or the like after the formation of the picture layer. In this case, the surface of the reflection type picture can be prevented from shining, and quiet tone of color can be obtained. These effects can be also realized by previously roughing the surface of the transparent support member to come into contact with the resin layer, and peeling the support member off the resin layer. This enables the glossiness to be easily controlled by changing the roughness of the surface.

In the first embodiment, four dots-shaped photopolymerization resin layers of yellow(Y), magenta(M), cyan(C) and black(B) are used. Instead, three-colored resin layers (Y.M.C.) may be used. The three-colored resin layers also enables the formation of desired colored picture sufficiently. But it is difficult for the combination of these three-colored layers to make white color. Accordingly, it is preferable to color the substrate white or whitelike color. When the substrate is colored not white, it is preferable to form a base layer of white or whitelike color on the substrate. When the substrate is transparent, another white-colored substrate is pasted on the transparent substrate.

The constructions of the display boards, of which the substrates are colored different colors from each other, are shown in FIGS. 7(A) through 7(D) (reflection type picture display board, third embodiment), and 8(A) through 8(C) (transmission type picture display board, fourth embodiment).

Figure 7A:
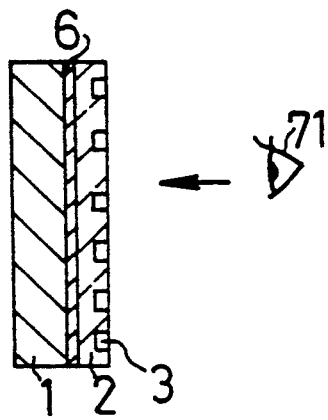
Figure 7B:
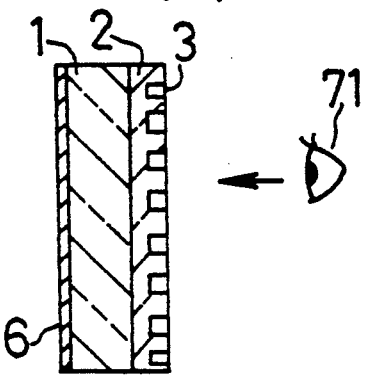
Figure 7C:
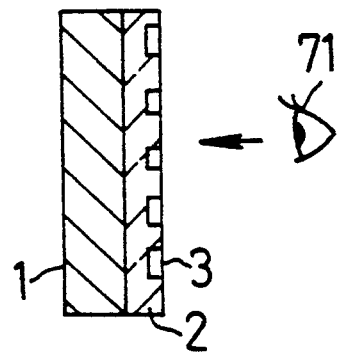
Figure 7D:
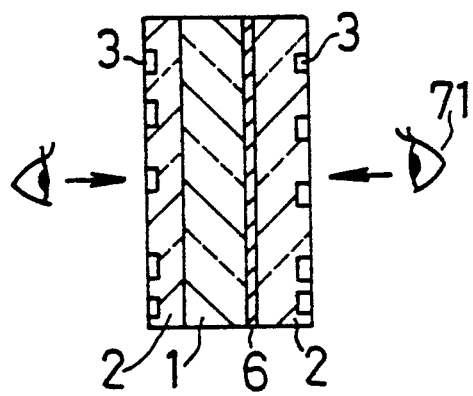
Figure 7E:
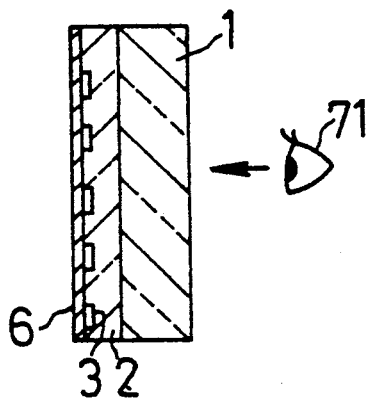

When the substrate 1 is not white, it is desirable to form a white-based layer 6 between the substrate 1 and the transparent photopolymerization resin layer 2 arranged on the side of an observer 71 as shown in FIG. 7(A). When the substrate is transparent, the white-based layer 6 is formed on the rear surface of the substrate 1 as shown in FIG. 7(B), or the picture layer 3 retained by the transparent photopolymerization resin layer 2 is further formed on the rear surface of the substrate 1 of the construction of FIG. 7(A). This is used as a two faces type display board(FIG. 7(D)). In addition, such a construction that the white-based layer 6 is formed on the picture layer 3, and the substrate 1 is arranged on the side of the observer 71 will do(FIG. 7(E)). FIG. 7(C) illustrates the construction of which the substrate 1 is white or white-based color.

The white-based layer 6 can have the basic composition equal to that of each of the above-described colored photopolymerization resin layer 5 except for different coloring agent being included. In this case, the density thereof is ranged from 0.3 to 1.0.

Figure 8A:
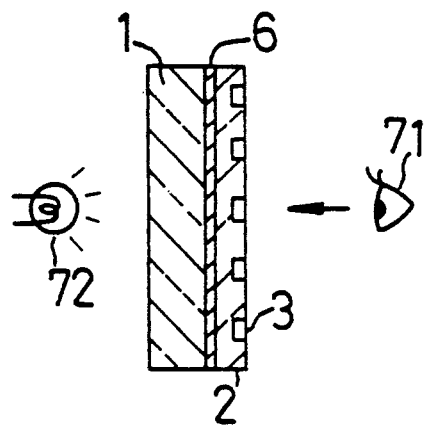
Figure 8B:
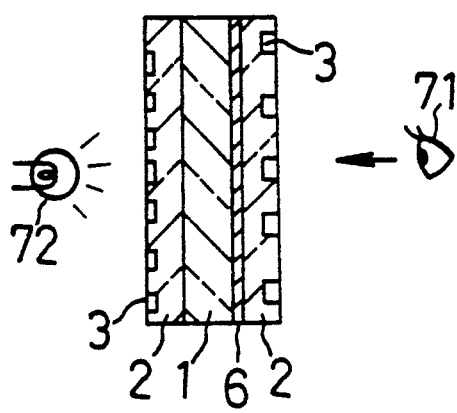
Figure 8C:
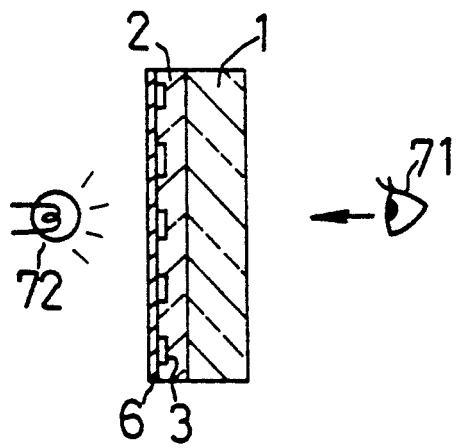

In the transmission type picture display board shown in FIGS. 8(A) through 8(C), the substrate 1 must have light transmission property in order to transmit light from a light source therethrough. And it is desirable to form the white-based layer 6 between the substrate 1 and the transparent photopolymerization resin layer 2(FIGS. 8(A) and 8(B)). Or such a construction that the white-based layer 6 is formed on the upper surface of the picture layer 3 and the substrate 1 is arranged on the side of the observer 71 will do(FIG. 8(C)).

Figure 9:
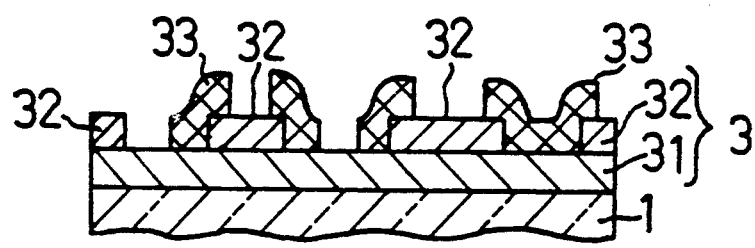
Figure 10:
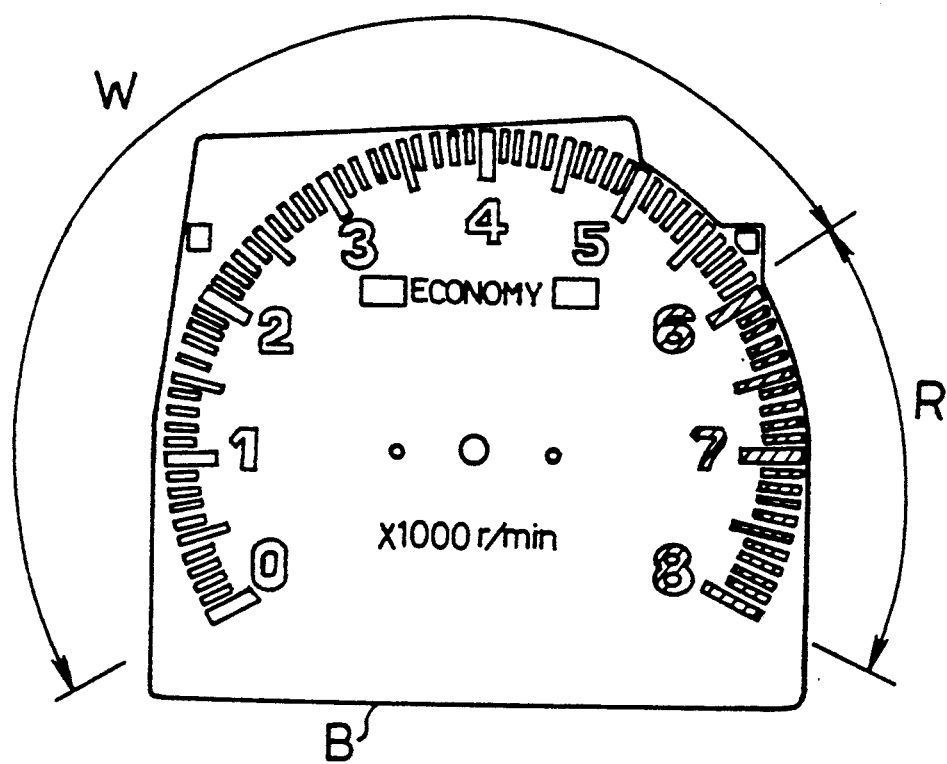
Figure 11:
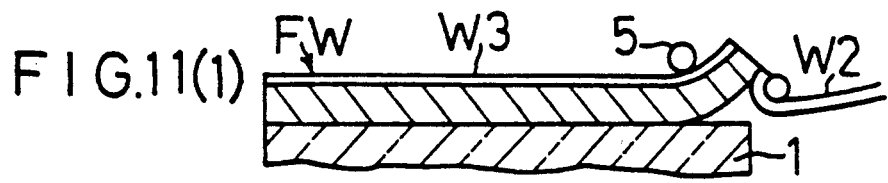
Figure 11:
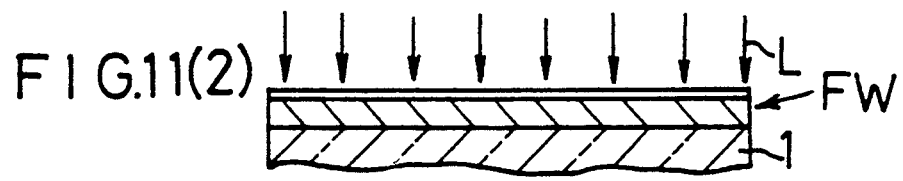
Figure 11:
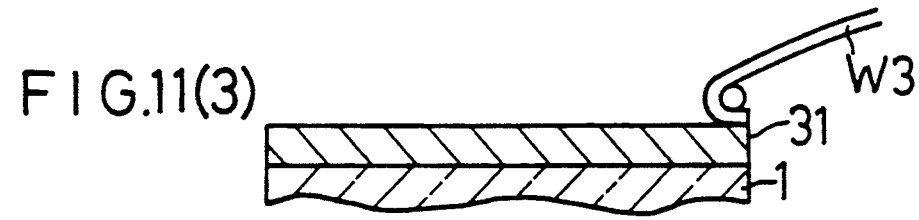
Figure 11:
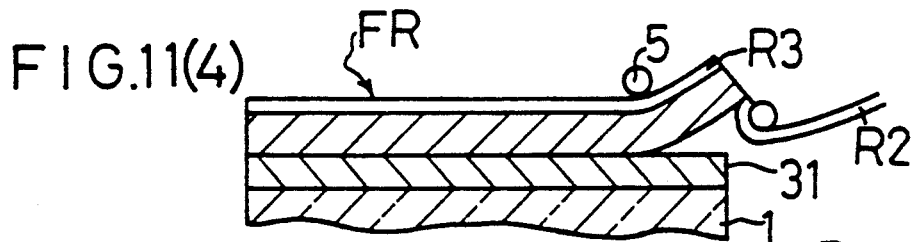
Figure 11:
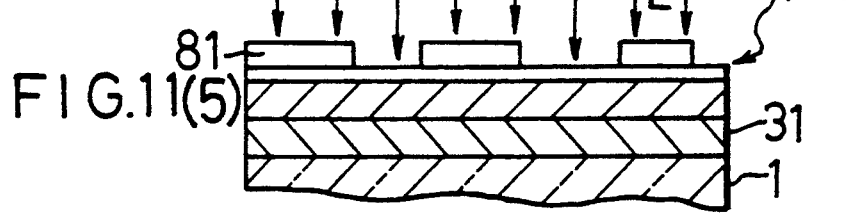
Figure 11:
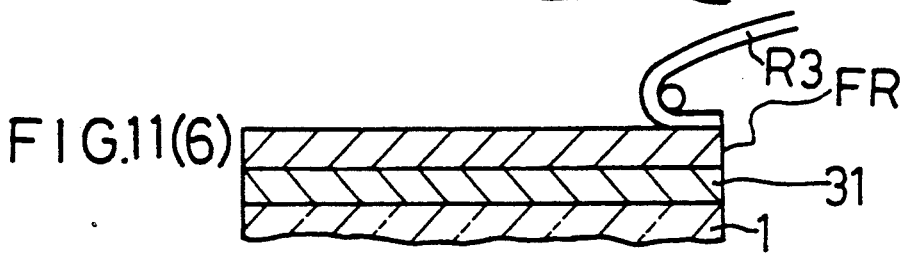

FIGS. 9 through 11 illustrate a fifth embodiment wherein the present invention is applied to a dial board of a tachometer for a vehicle. In this embodiment, the picture layer is formed by successively laminating colored photopolymerization resin films, each having a predetermined picture pattern, in place of using a compound layer of dots-shaped photopolymerization resins. And the figures, scales and letters in the region W of 0 to 6 are colored white while those in the region R of 6 to 8 are colored red, for example. The background except for these figures and scales is colored black.

FIG. 9 is a partially enlarged cross-sectional view of FIG. 10. A white picture layer 31 is formed on the substrate 1 made of transparent resin so as to cover the entire surface thereof. And a red picture layer 32 made of red photopolymerization resin is formed on the white picture layer 31 thereby forming the picture pattern corresponding to the figures and scales of the region R of FIG. 10. On the red picture layer 32 is formed a black picture layer 33 made of black photopolymirization resin, which corresponds to the background B. These picture v layers 31, 32 and 33 compose the picture layer 3.

The above-described dial board is produced as follows;

Each of the picture layers 31, 32 and 33 can be made of the colored photopolymerization resin film F shown in FIG. 3. In the fifth embodiment, the thickness of the colored photopolymerization resin layer F1 composing the picture layer is ordinarily 5 to 50 $\mu$m, preferably 10 to 15 $\mu$m in consideration of the visibility, appearance, color density or the like.

And the transparent support member F3 is desired to have good light transmission property in order to expose the colored photopolymerization resin layer F1 therethrough.

The photopolymerization resin films FW, FR, FB of white, red and black, each having the above-described construction were prepared, and a display board is produced in the processes shown in FIGS. 11(1) through 11(12).

Firstly, in the process shown in FIG. 11(1), the white polymerization resin film FW is pasted on the substrate 1(thickness: about 0.5 to 1.5 mm) and is made to pressure-adhere thereto by means of the laminater 5 while peeling a protective film W2 off the film FW.

Next, in the process shown in FIG. 11(2), the film FW is irradiated with active energy rays such as ultraviolet rays L to be exposed and set. The exposure is performed by means of an ultra high pressure mercury lamp, and the amount of exposure is preferably 200 to 500 mJ/cm$^2$ for white. Then, the transparent support layer W3 is peeled(Process of FIG. 11(3)) thereby forming the white picture layer 31(transmission intensity: 0.8 to 1.0) on the substrate 1.

In the process shown in FIG. 11(4), the red photopolymerization resin film FR is made to pressure-adhere to the white picture layer 31 while peeling a protective film R2. On this red polymerization resin film FR is placed a negative mask 81 corresponding to the region R of FIG. 10, and is contact-exposed(Process of FIG. 11(5)). Then, a transparent supporting layer R3 is peeled off the film FR(Process of FIG. 11(6)). The amount of exposure is preferably 200 to 500 mJ/cm$^2$.

In the process shown in FIG. 11(7), the wet development by using alkali or solvent, or the dry development is performed to remove unexposed portions from the film FR. This results in only the portions which are reacted to light so as to firmly adhere and be set, remaining thereby forming the red picture layer 32 corresponding to the figures and scales of the region R on the white picture layer 31 with the transmission density of 0.4 to 0.7).

Next, in order to form the figures, scales or the like of the region W, and display them sharply as well as to give them the function as the transmission type display board, black photopolymerization resin film FB is subjected to similar processes.

In the process shown in FIG. 11(9), the black photopolymerization resin film FB is made to pressure-adhere to the red picture layer 32 while peeling a protective film B2. And in the process shown in FIG. 11(10), a negative mask 82 is placed on the film FB, and contact-exposure is performed. The preferable amount of exposure is about 1000 mJ/cm$^2$.

Then, the transparent support layer B3 is peeled off the film FB(Process of FIG. 11(11)), and the development is performed(Process of FIG. 11(12)) to form a black picture layer 33 having a transmission density of 4 or more. Thus, the display board having the construction shown in FIGS. 9 and 10 is obtained.

By forming a masking picture layer having a large transmission density, such as the black picture layer 33, the obtained picture is observed as the reflection type picture in the daytime. In the nighttime, by placing a light source on the rear side of the substrate, the figures and letters transmit light to shine with various colors while the black background portion does not transmit light so that this construction can be used as the transmission type picture and illumination. In this case, it is preferable to use the masking picture layer having a transmission density of 2.0 or more.

Figure 12:
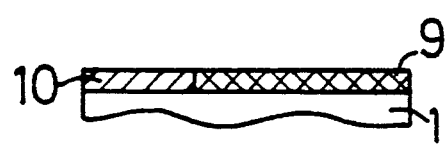
Figure 13:
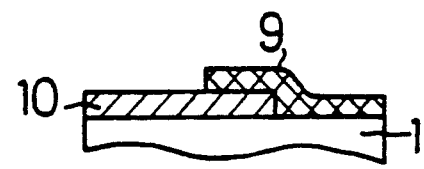

And a masking picture layer 9 may be arranged in contact with another picture layer 10 as shown in FIG. 12. Instead, an edge of the masking picture layer 9 may be laminated on another picture layer 10 as shown in FIG. 13. This construction enables the formation of a jointless beautiful picture.

When the photopolymerization resin is colored, the setting degree tends to be slightly lowered. But when the colored photopolymerization resin for the picture layer of the present invention has a setting degree of about 70% or more, the picture layer is not affected by remaining unreacted substances.

The present inventors' examination shows that the setting degree of the colored photopolymerization resin, and the picture quality have such relations to each other as shown in FIG. 14. The picture quality implies the color maintaining force, light resistance, adhesion property to the substrate, film hardness, heat resistance, heat cycle resistance or the like. At the setting degree of 70% or more, practically usuable picture quality can be obtained.

Picture layers, each having different setting degrees, were prepared from the colored photopolymerization resins having a thickness of 10 to 15 μm and a transmission density of about 1.3 in the thickness of 15 μm by varying the amount of exposure or the like. The relation between the setting degree and the film thickness is shown in FIG. 15. And the prepared picture layers having setting degrees of 50%, 70%, and 100%, respectively, were subjected to the durability test under the conditions shown in Table 3. The evaluation was performed as follows: Namely, when all of the checking items are satisfied, the mark ○ is inserted, and otherwise, the mark X is inserted in Table 3. As is apparent from Table 3, at the setting degree of about 70% or more, such high picture quality as to be sufficiently durable to long use can be obtained. Moreover, by adjusting the film thickness, color intensity, amount of exposure or the like, 100% of setting degree can be obtained.

TABLE 3

| Setting degree | Condition | | | |
|---|---|---|---|---|
| | 90° C. 1000 hr | −30° C. → 100° C. 1 hr ← 1 hr (1000 times) | 60° C. 95% RH 1000 hr | Sunshine meter (5000 hr) |
| 50% | X | X | X | X |
| 70% | ○ | ○ | ○ | ○ |
| 100% | ○ | ○ | ○ | ○ |

X ... insufficient
○ ... good
Checking items ... film hardness, flexibility, color change, glossiness, adhesion, color density (light resistance), resolution, workability When the substrate has light transmission property like that of the present embodiment, the setting degree can be further improved by exposing the previously formed picture layer from the rear surface of the substrate again. In this case, unreacted portions of the photopolymerization resin is reduced, and accordingly the setting degree is improved.

FIG. 16 illustrates a sixth embodiment of the present invention. In this embodiment, an adhesive layer 11 made of transparent photopolymerization resin is provided between the substrate 1 and the undermost picture layer(in this embodiment, the white picture layer 31). The other construction of the sixth embodiment is similar to that of the fifth embodiment. The adhesive layer 11 is transparent and does not include any dye or pigment so as to exhibit high setting degree as compared with the colored one whereby high adhesion of the picture layer and the substrate can be obtained. By exposing the substrate of the construction of the sixth embodiment from the rear surface thereof again, the adhesion of the picture layer and the substrate can be much improved. Accordingly, a display board which is excellent in the working resistance in drilling and assembling in a display panel, is obtained. The thickness of the adhesive layer 11 is ordinarily about 0.1 to 100 μm, and preferably about 5 to 10 μm.

FIG. 17 shows the result of the scratch test of the sample of the sixth embodiment by means of pencils of various hardness. In addition, the test results of the samples of the fifth embodiment, each being exposed in only the display surface thereof or in both display surface and rear surface thereof, are also shown for comparison. The test result shows that the samples of the fifth embodiment exhibit hardness(adhesion) good enough to be practically used, and by also exposing the rear surface and providing the adhesive layer in the sixth embodiment, the hardness(adhesion) is drastically improved.

Figure 18:
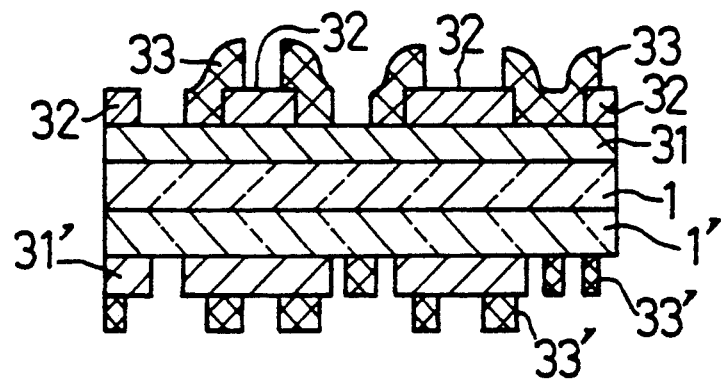
FIGS. 18 and 19 illustrate a seventh embodiment of the present invention.
Figure 19:
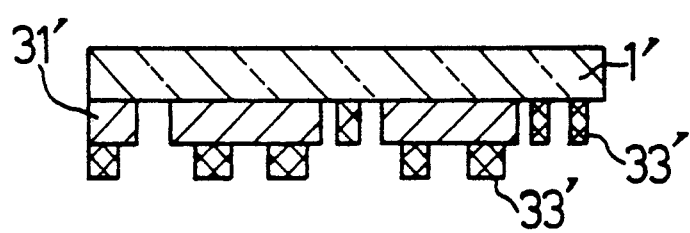

FIG. 18 illustrates a seventh embodiment of the present invention. In the present embodiment, in order to adjusting the amount of transmitting light, another picture layer shown in FIG. 19 is further laminated on a rear surface of the dial board of the tachometer for a vehicle shown in FIGS. 9 and 10. This construction prevents the lightness of the displayed picture from lacking uniformity due to the light source disposed on the rear side of the display board.

Figure 20:
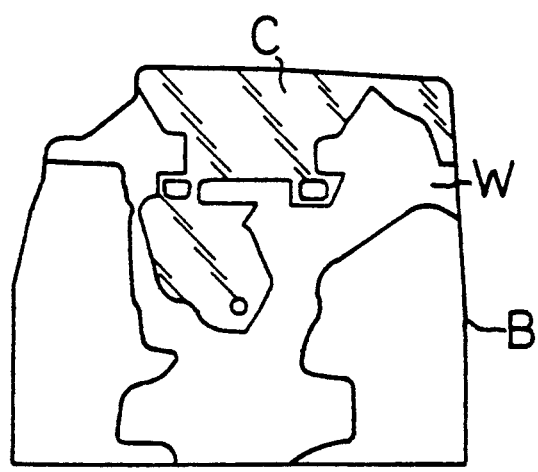
FIG. 20 is a front view of the picture for controlling the amount of the transmitted light.
Figure 21:
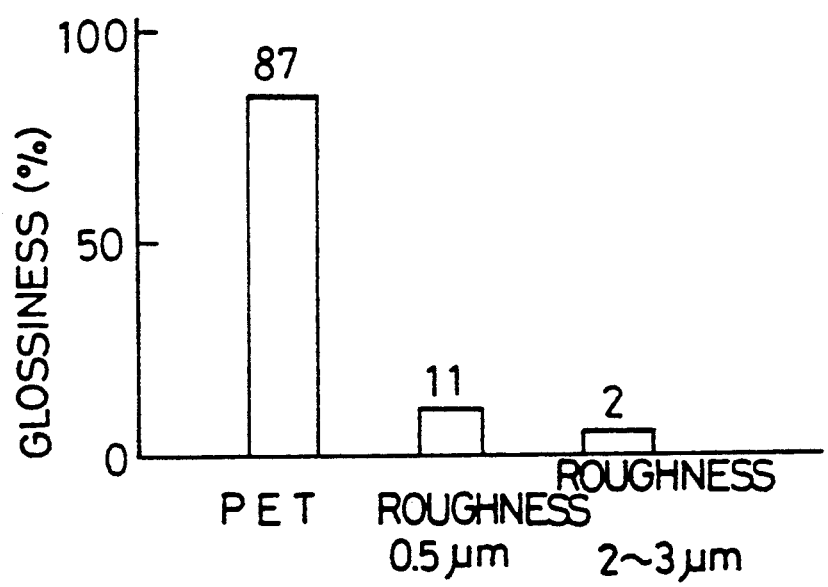
FIG. 21 is a view showing the relation between the roughness of a transparent supporting member and the glossiness of a picture layer.

In FIG. 19, the picture adapted for adjusting the amount of transmitting light is formed by successively forming a white picture layer 31' and a black picture layer 33', each having a predetermined pattern, on an under surface of a substrate 1' made of transparent resin so as to have a picture pattern as shown in FIG. 20, for example. In the drawing, the region B corresponds to the black picture layer while the region W corresponds to the white picture layer. The light source is disposed at a nearly central portion of the region B. The masking property is gradually decreased as the distance from the light source is increased. The picture layer is not formed in the region C which is comparatively remote from the light source. In the region C, the transparent substrate is exposed to the outside. This picture pattern is voluntarily changed in consideration of the lightness, position or the like of the light source.

The display board having the above described construction is produced as follows: Picture layers 31, 32, and 33 are previously formed on the substrate 1 while picture layers 31', 33' are previously formed on the substrate 1', and then, the substrates 1, 1' on which the picture layers are formed, respectively, are exposed again from the respective rear surfaces thereof to improve the hardness thereof. By further providing the adhesive layer shown in the sixth embodiment, the adhesion can be much improved. Thereafter, the substrates 1, 1' are pasted or secured to each other by means of bolts or the like so as to come into close contact with each other.

As described above, in accordance with the present invention, the display board may be composed by laminating a plurality of substrates on each of which desired picture layers are formed. In this case, the displayed picture can be made different between the reflection type display board and the transmission type display board. For example, by disposing a decorative picture as the background between the letter picture and the light amount adjusting picture, in the daytime, only the uppermost letter picture is perceived while at the time the light source is lighted up, the decorative picture is added to the letter picture to increase the decorativeness of the display board.

Moreover, in accordance with the present invention, the frosted picture can be obtained by roughing the surface of the picture layer to reduce the glossiness thereof. This frosted picture prevents the surface of the reflection type picture from shining, and give the picture quiet tone of color or the like. The frosted picture can be realized by previously roughing the surface of the colored photopolymerization resin film, which is to come in contact with the colored photopolymerization resin layer of the transparent support member, or roughing the surface of the formed picture layer by hot pressing. For instance, by varying the roughness of the transparent supporting member made of polyethylene terephthalate (PET), the glossiness of the surface of the picture layer can be reduced from 87% to 11%(roughness of the transparent support member:0.5 μm) or 2%(roughness of the transparent support member:2 to 3 μm).

In the preceding fifth through seventh embodiments, the picture is composed of three colors, white, red and black. In accordance with the present invention, the colors for composing the picture are not limited to these three colors. A plurality of films, each having a desired color can be voluntarily combined with each other. When the display board is not of transmission type, it is unnecessary to compose the substrate of transparent resin. Colored resin will do.

What is claimed is:

1. A display board comprising:
   a receiver base;
   a first non-clear colored photopolymerization resin layer including a first coloring agent of a first non-clear color, which is directly laminated on a surface of said receiver base to form a first picture pattern in said first color; and
   a second non-clear colored photopolymerization resin layer including a second coloring agent of a second non-clear color, said second colored photopolymerization resin layer being directly laminated both on at least a portion of said surface of said receiver base on which said first picture pattern is not formed, and on at least a portion of a surface of said first colored photopolymerization resin layer, to form a second picture pattern on said at least a portion of said surface of said receiver base and on said at least a portion of said surface of said first colored photopolymerization resin layer,
   whereby a two-dimensional non-flat display including said first and second picture patterns is formed with said second picture pattern being on at least two layers thereof.

2. The display board according to claim 1, wherein each of said first colored photopolymerization resin layer and said second colored photopolymerization resin layer has a thickness of between 5 and 50 μm.

3. The display board according to claim 1, wherein each of said first colored photopolymerization resin layer and said second colored photopolymerization resin layer includes a support member to which it is attached prior to being laminated on said surface of said substrate, thereby to increase the strength of each of said first colored photopolymerization resin layer and said second colored photopolymerization resin layer.

4. The display board according to claim 3, wherein a surface of said support member, which is to contact each of said first colored photopolymerization resin layer, includes a roughened area thereon. X 5. The display board according to claim 1, wherein said receiver base includes a third colored photopolymerization resin layer which is totally exposed and photopolymerized, and colored with a third non-clear color different from said first color and said second color, and said first colored photopolymerization resin layer is directly adhered to said third colored photopolymerization resin layer.

6. The display board according to claim 1, wherein said receiver base includes a first part composed of a transparent resin, and a third non-clear colored photopolymerization resin film on said transparent resin, and said first colored photopolymerization resin layer has an adhesion portion which adheres to said third colored photopolymerization resin film.

7. The display board according to claim 1, further comprising a light source for illuminating light to said receiver base from a side where said first colored photopolymerization resin layer is not provided.

8. A display board formed by the method comprising the steps of:
1) directly affixing a first colored photopolymerization resin layer of a first non-clear color on a surface of a receiver base;
2) exposing said first colored photopolymerization resin layer through a negative having a first picture pattern, to provide exposed portions and unexposed portions in said first colored photopolymerization resin layer;
3) removing said unexposed portions by wet development to directly form said first picture pattern of said first color, which includes said first colored photopolymerization resin layer;
4) directly pasting a second colored photopolymerization resin layer of a second non-clear color different than said first color, both on at least a portion of said surface of said receiver base on which said first picture pattern is not formed and on at least a portion of said first colored photopolymerization resin layer, and exposing said second photopolymerization resin layer through a negative of a second picture pattern to form exposed portions and unexposed portions of said second photopolymerization resin layer; and
5) removing said unexposed portions in said second colored photopolymerization resin layer by wet development to directly form said second picture pattern of said second color, which is composed of said second colored photopolymerization resin layer, on both said at least a portion of said receiver base and said at least a portion of said first colored photopolymerization resin layer to form a two-dimensional non-flat display including said first and second picture patterns, with said second picture pattern on at least two layers thereof.

9. The display board according to claim 8, wherein each of said first colored photopolymerization resin layer and said second colored photopolymerization resin layer has a thickness of 5 to 50 $\mu$m.

10. The display board according to claim 8, wherein each of said first colored photopolymerization resin layer and said second colored photopolymerization resin layer is supported by a support member prior to being directly pasted on said surface of said substrate for increasing the strength of each of said first colored photopolymerization resin layer and said second colored photopolymerization resin layer.

11. The display board according to claim 10, wherein a surface of said support member, which is to come into contact with each of said first colored photopolymerization resin layer and said second colored photopolymerization resin layer has a transmission density between 0.3 and 1.

12. The display board according to claim 8, wherein each of said first colored photopolymerization resin layer and said second colored photopolymerization resin layer has a transmission density between 0.3 and 1.

* * * * *